United States Patent [19]

De Angelo et al.

[11] E Re. 29,015

[45] Reissued Oct. 26, 1976

[54] METHOD OF GENERATING PRECIOUS METAL-REDUCING PATTERNS

[75] Inventors: Michael Anthony De Angelo, Ewing Township, Mercer County, N.J.; Donald Jex Sharp, Albuquerque, N. Mex.

[73] Assignee: Western Electric Company, Inc., New York, N.Y.

[22] Filed: Dec. 4, 1975

[21] Appl. No.: 637,504

Related U.S. Patent Documents

Reissue of:

[64] Patent No.: 3,562,005
Issued: Feb. 9, 1971
Appl. No.: 719,976
Filed: Apr. 9, 1968

[52] U.S. Cl. ..... 427/54; 427/98; 427/383 R; 427/304; 96/48 R; 96/49; 96/88; 96/92

[51] Int. Cl.[2] ..... B44D 1/50; H05K 3/12; H05K 3/18

[58] Field of Search ..... 427/54, 98, 383, 304; 96/48 R, 49, 88, 92

[56] References Cited

UNITED STATES PATENTS

| | | | |
|---|---|---|---|
| 2,154,506 | 4/1939 | Hinman et al. | 96/92 X |
| 3,183,094 | 5/1965 | Cerwonka et al. | 96/92 |
| 3,192,137 | 6/1965 | Dippel et al. | 427/405 |
| 3,259,559 | 7/1966 | Schneble, Jr. et al. | 427/437 |
| 3,377,174 | 4/1968 | Torigai et al. | 427/430 |

FOREIGN PATENTS OR APPLICATIONS

| | | | |
|---|---|---|---|
| 1,064,725 | 4/1967 | United Kingdom | 96/92 |

OTHER PUBLICATIONS

Kosar, Light Sensitive Systems, John Wiley & Sons, 1965, "Inorganic Compounds," paragraph 1.3b, pp. 37–39.

*Primary Examiner*—Ralph S. Kendall
*Attorney, Agent, or Firm*—J. Rosenstock

[57] ABSTRACT

A pattern capable of reducing thereon a precious metal is generated on a suitable substrate by first coating selected portions of the substrate with a solution, called a photopromoter, which contains a metal salt. The metal salt possesses two characteristics:

(a) the oxidation state of the salt (i.e., of the metal ion) is alterable (either increasable or decreasable) by exposure of the salt to radiation of the proper wavelength; and (b) in either the original or the altered oxidation state (but not in both states) the salt is capable of reducing a precious metal, e.g., a metal of the platinum group such as palladium, platinum or rhodium, from a salt thereof.

The photopromoter-coated substrate is next selectively exposed to the proper wavelength radiation to produce a pattern of the photopromoter salt capable of reducing the precious metal. The remainder of the salt is incapable of reducing the precious metal.

The pattern may then be exposed to a solution containing a salt of the precious metal to reduce thereon the precious metal. Ultimately, the precious metal pattern may be used to reduce electrolessly a metal, such as copper, to produce a metallic pattern, such as an electric circuit pattern.

31 Claims, 9 Drawing Figures

INVENTORS: M. A. DeANGELO
D. J. SHARP

BY J. D. Kaufmann
ATTORNEY

METHOD OF GENERATING PRECIOUS METAL-REDUCING PATTERNS

Matter enclosed in heavy brackets [ ] appears in the original patent but forms no part of this reissue specification; matter printed in italics indicates the additions made by reissue.

BACKGROUND OF THE INVENTION

Field of the Invention

This invention relates to a method of generating precious-metal-reducing patterns; and particularly, to a photographic-like method of generating, on a substrate, a pattern capable of reducing thereon a precious metal, which reduced precious metal is usable, for example, as a reduction catalyst in an autocatalytic electroless plating process.

Thus, in a more specific sense, the present invention relates to the production, by photographic-like techniques, of a starting product usable in an electroless plating process to produce a metallic pattern, such as an electric circuit pattern.

Discussion of the Prior Art

The frequency of use of so-called circuit boards has in recent times increased greatly. The advantages of such boards need not be enumerated, because they are well-known. Various methods for producing metallic patterns on substrates to produce the circuit boards are similarly well-known. These methods include, alone or in various combinations, positive and negative printing processes, positive and negative silk screening processes, positive and negative etching techniques, electroplating and electroless plating.

Electroless plating has found great favor with many workers in the art and has, in fact, been known in at least rudimentary form since before 1845 (see Symposium of Electroless Nickel Plating, published by the American Society for Testing Materials as ASTM Special Technical Publication No. 265 in November of 1959).

Generally speaking, electroless plating requires a so-called sensitization or catalization step during which a substrate surface to be electrolessly plated with a metal has placed thereon a material, usually a metal salt. This metal salt is capable of reducing the plated metal from an electroless bath without the use of an electrical current. Sensitization or catalization by such a material (called a "catalyst" or "sensitizer") is referred to as such because the materials used, usually the salts of the precious metals (palladium, platinum, gold, silver, iridium, osmium, ruthenium, and rhodium), serve as reduction catalysts in the autocatalytic electroless plating process. Often, sensitization or catalization is characterized as providing "nucleating sites" onto which the plated metal is "brought down" by a chemical reduction, or more generally, by a redox reaction. See, for example, U.S. Pat. Nos. 3,119,709 and 3,011,920.

Refinements of the basic electroless plating technique are necessary when the plated metal is electrolessly plated onto selected portions of a substrate surface in a pattern, rather than on the entire surface, to produce a circuit board.

The prior art embraces three broad categories of such refinements for producing electrolessly plated metallic patterns, namely, (I) masking, (II) selective, particulated catalyst placement, and (III) the use of photographic emulsions.

(I) MASKING

Masking, as it applies to metallic pattern and circuit board production by electroless plating, involves one of three techniques, all of which may utilize a photoresist or other type of mask.

First, after sensitization or catalization of the entire surface of a nonconductive substrate, a negative mask, having open areas which conform to the positive of the metallic pattern, is coated or placed onto the sensitized substrate surface. Subsequently, when the sensitized substrate is placed in an electroless bath, metal is reduced onto the substrate only where the mask is open.

This type of masking is inexpeditious for numerous reasons, among which are waste (the mask is not reusable when it comprises a photoresist) and registration difficulties. Moreover, such masking may result in poor edge definition of the metallic pattern by virtue of some of the electrolessly plated metal adhering to the mask as that metal is built up by the electroless plating. Subsequent removal of the mask removes some of the adherent metal from the edge of the metallic pattern.

Second, the substrate surface may be positively masked before sensitization. Sensitization, therefore catalyzes both the exposed surfaces of the substrate and the mask. The mask is either removed prior to, or is left in place during, electroless plating and is then removed.

Removal of the sensitized mask prior to electroless plating leaves portions of the substrate (conforming to a negative of the circuit pattern unsensitized, but is undesirable because, inter alia, on-line process time is involved and many solvents for the mask have been observed to have a deleterious effect on the catalyst.

Removal of the sensitized mask after electroless plating not only wastes metal which has been plated thereon, but also may result in poor edge definition of the electrolessly plated metallic pattern, as described above.

It should be noted that some workers in the art have observed that certain masking materials apparently reject the sensitizer (see Western Electric Technical Digest, No. 9, January 1968, p. 35). Such rejection is evidenced by the ability to remove, by a prolonged rinsing step, the sensitizer from the surface of the mask. However, this characteristic is not held by all masking materials, is not well-understood, and may be unpredictably manifested.

The third technique which may be referred to as masking comprises sensitizing and then electrolessly plating the entire surface of a substrate followed by selective etching of the plated metal to produce a metallic pattern. The selective etching is preceded by the application of a positive mask to the plated metal which prevents an etchant from attacking the metal thereunder.

Masking and selective etching of an electrolessly plated metal are undersirable for a number of reasons. Among these reasons are the extra time, money, and material required for the masking and etching steps. Additionally, etching may undercut the plated metal and the mask must be removed before electrical connections can be made to the metallic pattern where such is intended as a circuit pattern. Moreover, the plated metal which is etched away is wasted.

(II) SELECTIVE, PARTICULATED CATALYST PLACEMENT

Selective particulated catalyst placement generally comprises mixing a metal, such as palladium, in particulated form together with a resin binder or adhesive. This mixture is applied selectively to a substrate using standard printing techniques, for example, silk screening. Immersion of the substrate into an electroless bath is followed by the deposition of electroless metal onto the palladium particles, which serve as nucleating sites for reducing the electroless metal from the bath. See U.S. Pat. No. 3,259,559.

Selective catalyst placement is most disadvantageous. First, it is noted that a volatile component of the resin binder or adhesive must usually be driven off by heat or other energy to "cure" the binder or adhesive prior to immersion of the substrate into the electroless bath. This heat may have a deleterious effect on the substrate. Moreover, even after such volatile component has been driven off, the binder or adhesive may be subject to degradation (e.g., melting or thermal decomposition) upon the application of concentrated heat generated by soldering conductors to the metallic pattern when the pattern is used as a circuit pattern. Additionally, such an electroless coating usually exhibits surface roughness or "pinholes" which may sometimes be partially obviated by prolonged electroless plating. However, prolonged plating necessitates an undesirable additional expenditure of time, money and materials.

(III) USE OF EMULSIONS

The use of photographic emulsions generally includes an initial step of exposing a silver-containing, gelatinous emulsion to light where a metallic pattern is desired. Photographic development fixes the pattern and washing removes the emulsion which is not exposed. Electroless plating, the silver providing nucleating sites, produces a metallic pattern.

The use of emulsions is disadvantageous for several reasons, among which is a requirement for "safe light" conditions. That is, the emulsions must be protected from ambient light to prevent undesirable, nonselective fixing of the nucleating sites. In addition, photographic emulsions are often degraded by subsequent manufacturing operations. For example, concentrated heat due to a soldering operation may melt the developed emulsion causing the metallic pattern to "swim"; or the heat may thermally decompose the emulsion.

The most severe problem residing in the use of emulsions is the surface roughness of the metallic patterns produced thereby. This surface roughness is produced by the initial physical separation between the silver nucleating sites after the emulsion is fixed. Thus, rather long electroless plating times are required to ensure a smooth plated coating having no pinholes or craters. Insufficient electroless plating time leads to a rather rough-surfaced metallic pattern having poor electrical characteristics. Moreover, when electroplating on such a metallic pattern, the high currents used may cause "flashover" or arcing which may burn or render electrically discontinuous the pattern.

In summation, it may be said that masking (I), selective, particulated catalyst placement (II), and the use of emulsions (III) as they apply to electroless plating, are far from being optimum techniques. In addition, to the disadvantages noted above, none of these prior art techniques conveniently lends itself to the production of a sensitized or catalyzed substrate followed by storage of the substrate, electroless plating being effected at a later time. It should also be observed that none of the prior art techniques described above are continuous manufacturing processes, but rather are one-at-a-time, noncontinuous processes.

Moreover, categories (II) and (III) are observed to entail techniques for providing a bed or reservoir (i.e., the binder or the photographic emulsion) which "holds" nucleating sites to the substrate. This bed or reservoir, as noted above, may be subject to various types of degradation. Further, the bed adds thickness to the metal-patterned substrate which is undesirable in many cases, for example, where the substrate must be very flexible. Flexing a substrate with such a bed or reservoir thereon may ruin the overlying metallic pattern by cracking the underlying bed.

Lastly, all three of the above broad categories are incapable of generating satisfactory metallic patterns wherein individual pattern portions have dimensions or widths on the order of 1–2$\mu$ or a fraction of 1$\mu$, or wherein individual pattern portions are separated by distances on the order of 1$\mu$. Integrated microcircuits, with which metallic circuit patterns are used, require such dimensions and separations.

SUMMARY OF THE INVENTION

Accordingly, an object of this invention is to provide a new and improved method of generating precious-metal-reducing patterns.

Another object of this invention resides in the provision of a new and improved method of generating, on a substrate, a pattern capable of reducing thereon a precious metal, which reduced precious metal is usable as a reduction catalyst in an autocatalytic electroless plating process.

Further, another object of the present invention is the provision of a novel method for producing, by photographic-like techniques, a starting product usable in an electroless plating process to produce a metallic pattern, such as a circuit pattern.

Yet another object of this invention resides in a novel method of producing a pattern on a nonconductive substrate, such pattern being usable as a catalyst in the electroless reduction of a conductive metal thereon to produce a circuit-pattern wherein prior art masking, etching, mask removal, curing, silk screening, binders, adhesives, emulsions, photoresists, and other inefficient operations and materials and undue material waste are completely eliminated.

A still further object of the present invention is a photographic-like method of producing a precious-metal-reducing pattern on a nonconductive substrate by a continuous series of steps to produce a starting product for electroless plating, which product may be stored prior to its use in the electroless plating.

Another object of this invention is a method of generating metallic patterns on a suitable substrate, the method being capable of producing patterns having a definition of 1$\mu$ or less.

Another object of this invention is a new and improved method of generating a pattern onto which a metal may be electrolessly plated, the plated metal exhibiting improved edge definition over prior art methods.

An additional object of this invention is a novel method of producing a starting material for an electroless plating process whereby a smooth, even, pinhole-free electroless plate is efficiently deposited because of the enhanced properties of the starting material.

Yet another object of this invention is a method of generating, on a nonconductive substrate, a pattern capable of reducing thereon a precious metal, which generation does not entail the use of adhesives, binders, emulsions or other catalyst beds or reservoirs, the precious metal pattern being usable as a reduction catalyst in an electroless plating bath to produce a metallic pattern having improved characteristics as a consequence.

With these and other objects in view, the present invention contemplates a new and improved method of generating precious-metal-reducing patterns. A suitable substrate is first coated with a solution which contains a metal salt. Such solution is hereafter called a "photopromoter." The photopromoter possesses two characteristics:

(a) The oxidation state of the salt (i.e., of the metal ion) therein is alterable (that is, either increasable or decreasable) by exposure thereof to high energy such as actinic radiation or ultraviolet light quanta of short (less than 3000 A.) wavelength; and (b) In either the original or the altered oxidation state (but not in both states), the salt is capable of reducing a precious metal, for example, metals of the platinum group, such as palladium, platinum or rhodium, from a solution containing a salt of the precious metal.

The photopromoter-coated substrate is next selectively exposed to the ultraviolet light of short wavelength to produce a pattern of the salt capable of reducing the precious metal. The remainder of the salt is incapable of reducing the precious metal.

The actinically exposed substrate may then be immersed in a solution containing a salt of the precious metal to generate, by chemical reduction, a pattern of such precious metal. Ultimately, the precious metal pattern may be used as a catalyst to reduce thereon a metal, such as copper, for producing a metallic pattern in an autocatalytic electroless plating bath. The metallic pattern may be used as a circuit pattern of a circuit board.

Two broad categories of photopromoter solutions are contemplated.

The first category contains metal salts which in their original oxidation state are capable of reducing a precious metal. When such a photopromoter is used, the selective photopromoter-coated substrate is exposed selectively to the actinic radiation where the ultimate metallic pattern will not reside. Such exposure places the salt thereat in a higher oxidation state (i.e., in the altered oxidation state) wherein the exposed salt is rendered incapable of reducing the precious metal.

The second category contains metal salts which in their original oxidation state are incapable of reducing a precious metal. When this type of photopromoter is utilized, the photopromoter-coated substrate is selectively exposed to the actinic radiation where the ultimate metallic pattern will reside. Such exposure renders the salt thereat capable of reducing the precious metal by placing the exposed salt in a lower (i.e., in the altered) oxidation state.

Some of the photopromoters utilized in the instant invention have been recognized as useful chemical entities for some time. However, even though the phenomenon of electroless plating has been known for over 120 years, as pointed out above, none of these photopromoters have been incorporated into an electroless plating process in the novel manner of this invention.

BRIEF DESCRIPTION OF THE DRAWINGS

Other objects and advantages of the present invention will appear upon consideration of the following detailed description in conjunction with the accompanying drawings wherein.

DETAILED DESCRIPTION

Figure 1:
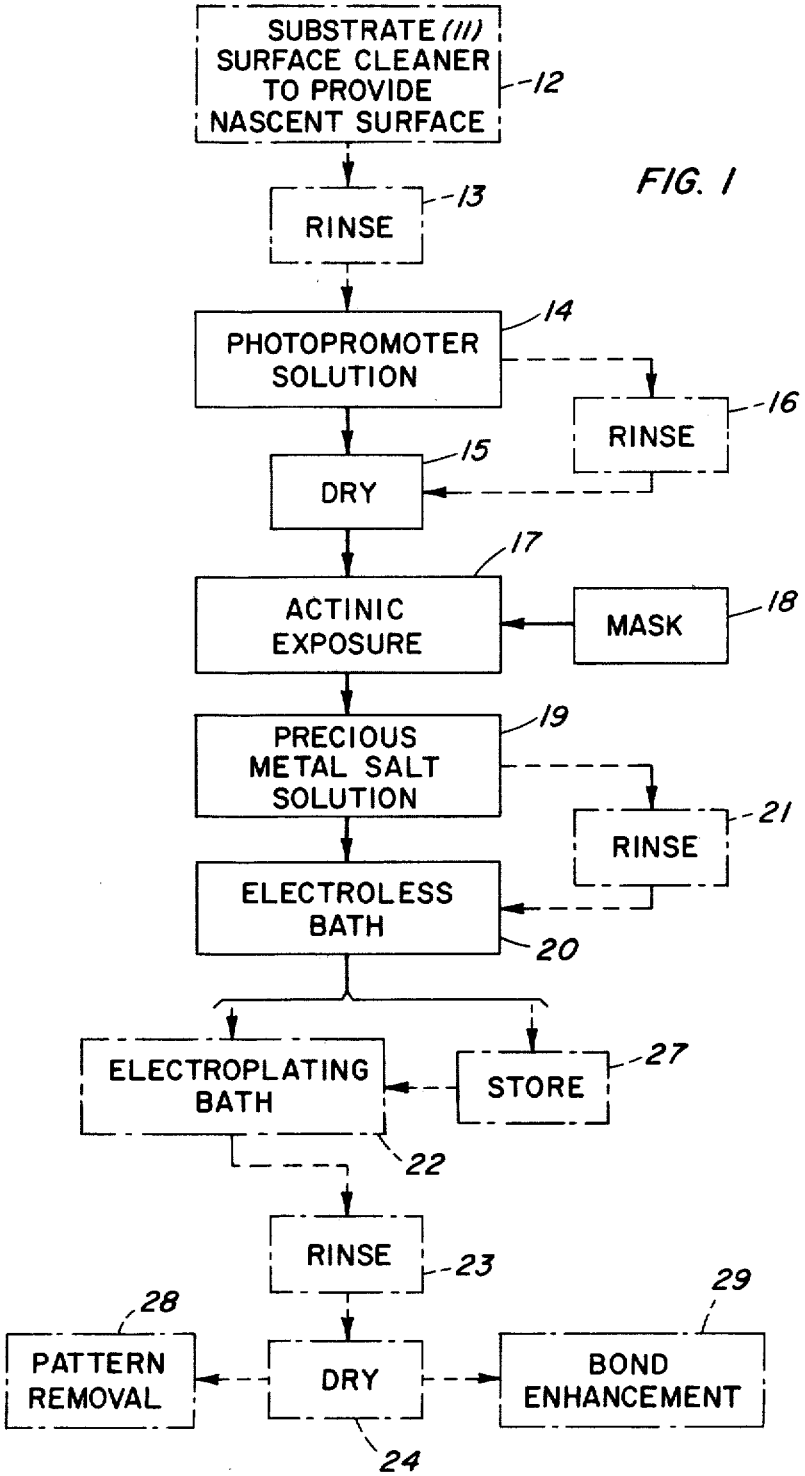
FIG. 1 is a generalized flow chart depicting, step-by-step, the present new and improved method of generating precious-metal-reducing patterns and including the optional steps of producing a precious metal pattern and a metallic pattern electrolessly deposited thereon and reduced thereby.

Preliminarily, definitional bounds will be placed on certain language contained herein.

The terms "negative" or "negative mask" refer to a process employing a mask to produce a pattern which is opaque where the mask is not opaque. That is, the solid portion of the mask is a negative representation of (or does not replicate) the pattern.

The terms "positive" or "positive mask" refer to a process employing a mask to produce a pattern which is opaque where the mask is opaque. That is, the solid portion of the mask is a positive representation of (or replicates) the pattern.

"Catalyst" refers to a substance or material which initiates or accelerates a chemical reaction but which itself remains chemically unchanged, or is at least not permanently changed at the end of the reaction.

"Promoter" in the present context refers to a substance other than a "catalyst" which promotes or encourages a chemical reaction. A promoter differs from a catalyst in that the promoter does undergo a chemical change in performing its function.

"Photopromoter," a term used previously, defines substances which, upon being exposed to appropriate radiation, either (a) dissipate chemical energy already possessed thereby or (b) store chemical energy not previously possessed thereby. When these substances possess or have stored chemical energy, they are capable of acting as promoters, a term defined immediately above. The dissipation or storage may be either a primary reaction caused by the radiation or a secondary reaction brought about by unspecified primary reactions to the radiation. Typically, the dissipation of chemical energy is manifested by the transition of the oxidation state or number of a metal salt (or metal ion) from a chemically active low number to a less chemically active high number. The storage of chemical energy is manifested by a reverse process.

Specifically, the first type [(a)] of photopromoter is rendered incapable of acting as a promoter if and where such photopromoter is exposed to the radiation. A photopromoter of this first type is inherently capable of acting as a promoter if and where it is not exposed to the radiation. The second type [(b)] of photopromoter is rendered capable of acting as a promoter only if and where exposed to the radiation. A photopromoter of this second type is inherently incapable of acting as a promoter if and where it is not exposed to the radiation.

"Precious metals" includes metals of the "platinum group" (iridium, osmium, palladium, platinum, rhodium and ruthenium) and gold and silver.

"Adsorption" is defined as a surface phenomenon exhibited by solids which is evidenced by adhesion in an extremely thin layer of the molecules of a liquid to the solid. Adsorption may be due to physical or chemical forces exerted on the molecules of a liquid by the surface of a solid with which the liquid is in contact.

"Actinic radiation" in this context is ultraviolet radiation deep within the ultraviolet spectrum. Specifically, such radiation possesses a short wavelength of less than 3000 A. and within the approximate range of from about 1800 A. to about 2700 A.

A wide variety of substrate materials are suitable for use in the present invention. Electrically nonconductive polyimide films, semipolymerized silicone films, "B stage" epoxy films or unfired ceramics are preferred, however, when this invention is used to produce electrical circuit patterns. Nevertheless, other types of substrate materials such as polyamides, paper, cloth, fiberglass, other plastics, glass, and fired ceramics may be used.

Referring now to FIG. 1, the initial step of the subject method may comprise subjecting a surface of a substrate 11 to a cleaner, as shown at 12, which renders the substrate surface "nascent." A nascent surface is a surface on which a solution is retained after the surface is immersed therein. Such retention may be caused by any one or combination of the phenomena known as adsorption, physical adsorption, chemisorption, wetting, or absorption. In any event, the surface must be capable of retaining a thin layer of the solution. Thus, the cleaner may be unnecessary and is described here only as a possible expedient in the event the surface is not already nascent. As an example, when a polyimide film is used as a substrate, it has been found convenient to clean the surface thereof by momentary immersion in NaOH. This immersion actually removes a very minute amount of the film, ensuring that the film's surfaces are nascent. On the other hand, a ceramic substrate may be rendered nascent by momentary immersion in a mixture of $HNO_3$ and HF. Other expedients, such as sandblasting, may be used to render the substrate surface nascent.

The nascent substrate surface may then be bathed in a rinse 13 of deionized, clean water or of zeolite-exchanged water. All subsequent water rinsings are of a similar character.

Next the nascent surface is immersed in a photopromotor solution, represented at 14. The photopromoter, as previously described and defined, is a solution which contains a metal salt having specific properties. The photopromoter may be nonaqueous but is typically aqueous, and, in any event, is retained as a thin layer on the nascent substrate surface.

Worthy of mention is the fact that such retention depends on phenomena previously discussed and not on the adhesives, binders, emulsions or beds of the prior art. For example, an aqueous stannous chloride solution has been observed to adsorb on a nascent polyimide surface while an aqueous ferric oxalate solution has been observed to be retained on a nascent ceramic surface by an uncharacterized mechanism which may be a combination of the phenomena of absorption, adsorption and wetting.

The metal salt in the photopromoter 14 possesses two characteristics, namely:

(a) The oxidation state or number of the salt is alterable (either increasable or decreasable) by exposure of the salt to radiation of the proper wavelength, that is, actinic radiation which is typically short ultraviolet light of less than 3000 A.; and (b) In either the original or the altered oxidation state (but not in both states) the salt is capable of reducing a precious metal, for example palladium, from a solution containing a salt of the precious metal.

Two general classes of photopromoter solutions have been discovered.

The first group of such solutions is denoted as the positive group. The positive group includes solutions which contain a metal salt capable in its original state of reducing the precious metal. Proper exposure of this group of solutions to the actinic radiation places the salt in a higher, less chemically active oxidation state wherein the salt is incapable of acting as a promoter by reducing the precious metal. Positive photopromoters are type (a), discussed above.

Accordingly, when a positive photopromoter solution has been retained on the nascent substrate surface, the salt is subsequently exposed to the actinic radiation only where a conductive metal pattern is not ultimately desired, that is, through a positive mask.

The second group of photopromoter solutions is referred to as the negative group. The negative group includes solutions which contain a metal salt having an originally higher and less chemically active oxidation state which renders the salt incapable of reducing the precious metal. Proper exposure of the negative group of solutions to the actinic radiation reduces the oxidation state or number of the salt rendering the salt more chemically active and capable of reducing the precious metal. Negative photopromoters are type (b), discussed above.

Accordingly, when a negative photopromoter solution is retained on the nascent substrate surface, the salt is exposed to actinic radiation only where a conductive metal pattern is ultimately desired, that is, through a negative mask.

After the immersion of the nascent substrate surface in and the retention of the photopromoter solution thereon, the substrate is dried as shown at 15. Such drying may be preceded by bathing in a clean water rinse 16 if the photopromoter 14 is of a type (e.g., stannous chloride) which absorbs on the nascent substrate surface. Otherwise the rinse 16 is not used.

It has been found that drying of the retained photopromoter 14 leaves behind on the substrate surface a residue which includes the metal salt, termed a photopromoter salt, formerly in solution. This residue is retained by the surface. If a positive photopromoter has been used, such retained salt is in a low oxidation, chemically active state capable of reducing a precious metal. If a negative photopromoter has been used, the retained salt of the residue is in a high, chemically inactive state incapable of reducing a precious metal.

The mechanism by which the salt is left behind on and retained by the nascent substrate surface is not clear. Such retention may be due, again, to physical forces, adsorption, chemisorptive forces, or the like. In any event, such retention is an accomplished fact at this point in the process and requires no adhesives or the like.

The drying (15) of the substrate 11 is a desirable expedient. As noted previously, and as more fully described below, the retained salt of the photopromoter 14 is subsequently exposed to short (about 1800 A. to about 2700 A.) wavelength, ultraviolet light or actinic radiation as at 17. If the photopromoter is not dried, a liquid layer remains on the substrate surface. Such layer has been observed to attenuate and even prevent the chemical action which the actinic radiation is intended to effect in the photopromoter salt. This attenuation is especially noticeable when the photopromoter is an aqueous solution.

Next, the retained salt of the photopromoter is exposed selectively to the actinic, ultraviolet radiation (17), e.g., through a mask represented at 18. This exposure produces a pattern of the retained salt on the substrate surface which is capable of reducing a precious metal. The remainder of the salt is incapable of reducing the precious metal. Of course, the type of mask (negative or positive) used is dictated by the character of the photopromoter solution and salt. Specifically, if a positive photopromoter solution is used, the mask is a positive mask which permits the radiation to strike the retained salt only where a metallic pattern is not ultimately desired. If a negative photopromoter solution is used, the mask is a negative mask which permits the radiation to strike the retained salt only where a metallic pattern is desired.

Obviously, instrumentalities other than the mask 18 could be used to selectively expose the retained salt to the proper radiation. For example, the salt residue may be swept by a fine beam of the actinic radiation which may be controlled by a computer or by rotating mirrors.

It should be noted that the use of a positive photopromoter 14 permits the efficient reduction of the precious metal on the walls of holes in the substrate 11. Specifically, if holes of small diameter are formed in the substrate 11 prior to immersion thereof in the positive photopromoter solution 14, the selective exposure to the actinic radiation does not impinge upon the salt retained by the hole walls after drying. Thus, the hole walls are rendered capable of reducing the precious metal.

The actinic radiation-exposed substrate is next immersed in a catalyst or sensitizer solution 19 containing a salt of a precious metal. The pattern of the photopromoter salt (whether of the positive or negative variety) which is capable of reducing the precious metal does in fact now reduce such precious metal onto the pattern. This reduction may be said to effect selective sensitization or catalization of the substrate 11 by rendering the pattern catalytic to an electroless plating bath 20.

It should be noted, that in some instances, it is possible to mix together in a single bath, the photopromoter 14 and the precious metal salt solution 19. The nascent substrate surface is immersed in this mixture and then exposed to the actinic radiation 17. Obviously, such a mixture may be used only in the case of a negative photopromoter.

Following the immersion in the precious metal salt solution 19, the selectively catalyzed substrate 11 may be water bathed in a rinse 21, subjected to the electroless plating bath 20, subjected to an electroplating bath 22, bathed in a water rinse 23, and finally dried as at 24. The electroless and electroplating baths 20 and 22 may contain salts of a variety of metals including copper, nickel, cobalt, palladium, platinum, silver or gold.

In the electroless plating bath 20, the precious metal pattern provides nucleating sites for the metal contained therein. The occurrence of electroless plating, sometimes referred to as "physical development," is well-known. The electroless metal is built up on the pattern for a sufficient time dictated by the ultimate use of the metallic pattern. If it is desired to subsequently electroplate, the electrolessly plated pattern at 22, sufficient metal thickness (e.g., 1500 to 3000 A.) must be built up in the electroless bath 20 to render the metallic pattern sufficiently thick to withstand both the electroplating current and the acidity of the electroplating bath 22 without being rendered discontinuous by arcing.

It is worthy of mention that all of the photopromoter solutions 14, whether negative or positive, do not require safe light conditions during any step of the process. That is to say, photopromoter solutions 14 have been discovered which are responsive to the radiation of the selected wavelength, which radiation is substantially absent from the ambient environment. The photopromoter solutions 14 utilized herein respond to the actinic ultraviolet radiation 17 having a wavelength in the approximate rage of 1800 to 2700 A., or, more generally, below 3000 A.

The substrate 11 may be conveniently stored or shipped after the electroless bath, as indicated at 27. The substrate 11 may then be transmitted to the ultimate metallic pattern user or producer who may then himself electroplate metallic patterns on the film. In any event, after electroplating, at 22, the metallic pattern may be subjected to one of two steps, namely, removal, depicted at 28 or a bond enhancement treatment, shown at 29.

The adherence of the metallic pattern to the substrate 11 has been observed to be quite good and comparable to prior art methods. However, the pattern may, if care is used, be removed (delaminated) from the substrate, or the substrate may be dissolved by a substance which is inert to the metallic pattern. In either event, both of which are represented at 28, disassociation of the metallic pattern from the substrate 11 may be the final step in producing an electroformed metal article, such as a lead frame for use in the manufacture of integrated semiconductor devices. Thus the thrust of the present method may be the production of a metal article by electroforming using the substrate 11 as a temporary carrier. Obviously, articles of substantial thickness may be produced by lengthening the time the electrolessly plated pattern dwells in the electroplating bath 22.

If a substrate 11 is used which is made of one of the preferred materials, the thrust of the present method may be the production of a metallic pattern permanently residing on the substrate, for example, as an electric circuit board pattern. In this event, it may be desirable to enhance the bond between the metallic pattern and the substrate as depicted at 29.

Such enhancement may be effected by completing the polymerization of the silicone resin, completing the curing of the epoxy film, or firing the ceramic, depending on the type of substrate used, which results in bond strengths of 5–15 lbs./linear inch.

When a polyimide film is used, the bond enhancement entails heating the substrate and metallic pattern in an atmosphere conducive to the formation of oxides of the metal of the pattern and to a temperature below the service temperature of the polyimide. Such heating has been found to induce the growth of a metal oxide on the metallic pattern at the pattern-polyimide interface. Oxide growth in this manner drives the oxide into the polyimide to increase the pattern-polyimide bond to about 15 lbs./linear inch. Such oxide growth may be due to the permeability of polyimides to the oxide formation-conducive atmosphere.

The wavelength range of the actinic radiation 17 utilized in this invention may explain why the method of this invention has remained undiscovered for over 145 years. Actinic radiation deep in the ultraviolet spectrum and in the 1800 to 2700 A. wavelength range is not only seldom used in research and in commercial industrial processes, but is also attenuated by air to such a great extent that it is not normally present under ambient conditions. In addition, substances other than air, for example, common glass, translucent or transparent plastics and thin liquid layers similarly attenuate such radiation. As a matter of fact, it has been found that only certain materials, such as quartz, quartz-related glasses and boro-silicates, efficiently transmit without substantial attenuation, the actinic radiation used in this invention. Use is made of this characteristic as described below.

The positive photopromoter solutions and the negative photopromoter solutions are now described in detail.

A number of negative photopromoters [type(b)] have been discovered with effect efficient selective reduction of a precious metal following selective exposure to the actinic radiation 17. Six of these solutions are: ferric oxalate, ferric citrate, ferric tartrate, mercuric oxalate, mercuric citrate, and mercuric tartrate.

The ferric ion or salt in any of the first three photopromoter solutions is configurated as follows:

$$Fe^{+3} \text{ or } Fe^{+++}$$

while the mercuric ion is configurated as:

$$Hg^{+2} \text{ or } Hg^{++}$$

Exposure of the ferric ion in the photopromoters to the actinic radiation alters that ion to the ferrous ion:

$$Fe^{+2} \text{ or } Fe^{++}$$

while exposure of the mercuric ion alters such ion to the mercurous ion:

$$Hg^{+}$$

Both of the lower oxidation state and more chemically active ions (ferrous [$Fe^{++}$] and mercurous [$Hg^{+}$]) are capable of reducing a precious metal. The reaction for the actinically rediated ferric ion, when a palladium chloride precious metal sensitizer solution 19 is used, is:

$$Fe^{+++} \xrightarrow{hv} Fe^{++}$$

$$Fe^{++}+Pd^{++} \rightarrow Pd^{\circ}+Fe^{+++}$$

The reaction for the mercuric ion, when the same sensitizer is used, is:

$$Hg^{++} \xrightarrow{hv} Hg^{+}$$

$$Hg^{+}+Pd^{++} \rightarrow Pd^{\circ}+Hg^{++}$$

In both cases, hv is the quanta of energy carried by the actinic radiation 17 and applied to the higher oxidation state photopromoter salts to render such salts more chemically active.

The rection for the ferric and mercuric ions not exposed to the actinic radiation is:

$$Fe^{+++}+Pd^{++} \xrightarrow{x} \text{No reaction, and}$$

$$Hg^{++}+Pd^{++} \xrightarrow{x} \text{No reaction}$$

It should be noted that the expressions:

$$Fe^{+3} \xrightarrow{hv} Fe^{+2} \text{ and}$$

$$Hg^{+2} \xrightarrow{hv} Hg^{+}$$

may not define primary reactions. Such expressions may represent partial secondary reactions and illustrate only what ultimately happens to the ferric and mercuric ions.

For example, the complete reaction for the ferric oxalate photopromoter may be:

$$Fe_2(C_2O_4)_3 \rightarrow 2Fe^{+3}+C_2O_4$$

$$C_2O_4^{-} \xrightarrow{hv} 2CO_2+2e$$

$$2Fe^{+3}+2e \rightarrow 2Fe^{+2}$$

where the two electrons (2e) broken away from the oxalate by the actinic radiation, make a ferrous ion from a ferric ion.

To ensure that the negative photopromotor solutions contain only the higher oxidation state metallic ions prior to actinic radiation exposure, a trace (½% or less) of an oxidizer may be placed in the photopromoter solution 14. For example, it is known that commercial solutions of ferric oxalate generally contain a certain percentage of the $Fe^{++}$ (ferrous) ion. To ensure that all ions in the solution are in the $Fe^{+++}$ (ferric) state prior to the actinic exposure, a trace amount of an oxidizer, such as nitric acid, may be added to the solution 14. The addition of the oxidizer prevents the precious metal from being reduced by $Fe^{++}$ ions on the substrate where such reduction is not desired, this undesirable effect being referred to as "fogging." Only trace amounts of nitric acid are added because such amounts of the relatively volatile acid are easily driven off when the substrate is dried at 15. Greater amounts of nitric acid would reoxidize the actinically exposed, lower oxidation state ion (i.e., $Fe^{++}$) back up to the higher oxidation state (i.e., $Fe^{+++}$). Thus, too much oxidizer in the photopromoter solution negates the actinic radiation exposure.

At least three classes of positive photopromoter solutions are known. Such classes are the tin halides, the titanium halides and the lead halides. The positive photopromoters include, inter alia, tin chloride, tin bromide, titanium chloride, titanium bromide, lead chloride, and lead bromide.

The [ negative ] *positive* photopromoter solutions contain metal ions which in their normal state are capable of reducing a precious metal. The three ions are, respectively:

$Sn^{+2}$ or $Sn^{++}$ $Ti^{+3}$ or $Ti^{+++}$ $Pb^{+2}$ or $Pb^{++}$

Exposure of such negative photopromoter solutions to the actinic radiation places these ions in a higher, less chemically active oxidation state incapable of reducing the precious metal. The reactions for the three photopromoter solutions when palladium chloride is used as a sensitizer 19 are given below:

$$Sn^{++} \xrightarrow{hv} Sn^{++++}$$

$$Sn^{++++}+Pd^{++} \xrightarrow{x} \text{No reaction}$$

$$Sn^{++}+Pd^{++} \rightarrow Pd^{o}+Sn^{++++}$$

$$Ti^{+++} \xrightarrow{hv} Ti^{++++}$$

$$Ti^{++++}+Pd^{++} \xrightarrow{x} \text{No reaction}$$

$$Ti^{+++}+Pd^{++} \rightarrow Pd^{o}+Ti^{++++}$$

$$Pb^{++} \xrightarrow{hv} Pb^{++++}$$

$$Pb^{++++}+Pd^{++} \rightarrow \text{No reaction}$$

$$Pb^{++}+Pd^{++} \rightarrow Pd^{o}+Pb^{++++}$$

It should be noted that the first two lines of each of the three groups of reactions refer to those portions of the substrate exposed to actinic light whereat a conductive pattern is not desired. The first line represents a reaction whereby ions are produced by the actinic radiation 17 which are incapable of reducing the precious metal as shown by the second line. The third line of each of the three reactions refers to chemical action taking place at those portions of the substrate which are not exposed to the actinic radiation 17.

PREFERRED APPARATUS EMBODIMENTS

Figure 2:
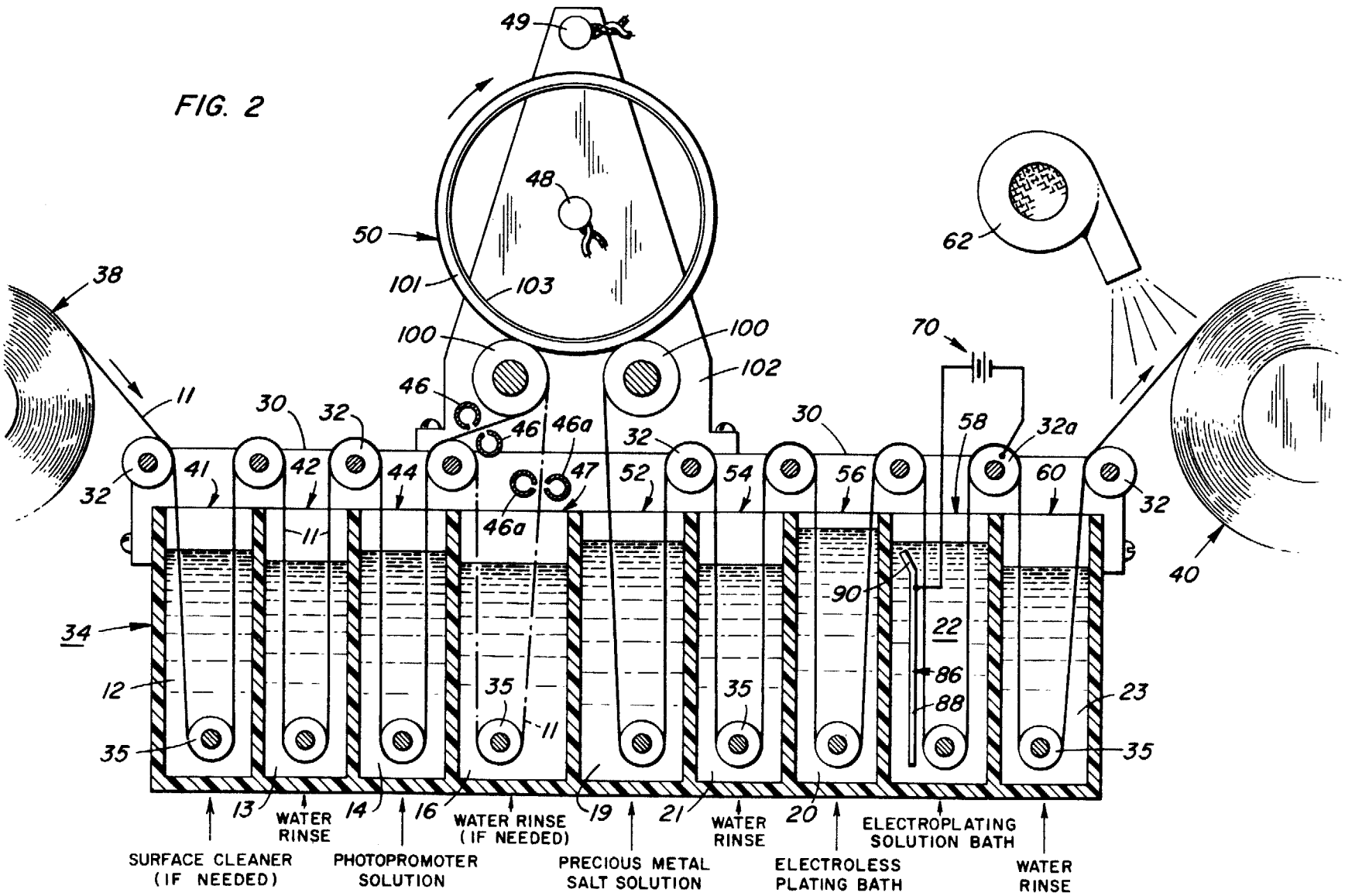
FIG. 2 is a side elevational view of apparatus which may be used to carry out the method depicted in FIG. 1.

Referring now to FIG. 2, a typical embodiment of one form of apparatus for effecting the previously described inventive method is shown.

On a support member 30 are rotatably mounted a plurality of upper rollers 32. One of these rollers 32a may be made of a conductive material such as copper, while the remainder are made of a nonconductor, such as plastic. The support member 30 rests on top of a network 34 of serial tanks each of which has rotatably mounted therein one or more of a plurality of nonconductive lower rollers 35. The substrate 11, made of a suitable flexible material, is pulled into and out of the tanks of the network 34, over the rollers 32 and under the rollers 35 from a supply reel 38 by a takeup reel 40 driven by a motor (not shown).

The substrate 11 first enters a tank 41 containing the cleaner 12 where the substrate surface is rendered nascent, as previously described. Should the surface of the substrate 11 be nascent as it comes from the supply 38, the tank 41 is not used.

The substrate 11 next moves into a tank 42 containing the deionized or zeolite-exchanged water rinse 13. After being rinsed in the tank 42 the substrate 11 moves into a tank 44 which contains one of the photopromoters solutions 14 described above.

In the tank 44 the photopromoter solution contacts the nascent substrate surface enabling the surface to retain the photopromoter 14 as described previously. Specifically, the positive photopromoters adsorb onto the nascent surface, while other photopromoters are retained on the surface by other mechanisms such as wetting, chemisorption, etc.

As the substrate 11 moves out of the tank 44, an air blast from a pair of air knives 46 may be directed against the substrate 11. Such air blast dries (15 in FIG. 1) the substrate 11, for example, by evaporating the water from an aqueous photopromoter or the volatile components from a nonaqueous photopromoter.

A following tank 47 contains the deionized water rinse 16. The tank 47 is used only where the photopromoter 14 is one which adsorbs on the nascent substrate surface, such as a tin halide solution. Adsorption makes it virtually impossible to rinse away the metal salts adsorbed on the substrate surface, and the rinsing may be desirable to ensure that the adsorbed photopromoter layer is as thin as possible. This thinness enables the actinic radiation 17 to be aberrated as little as possible by refraction or diffusion which might otherwise be caused.

The path taken by the substrate 11 in the case of a photopromoter which adsorbs is shown in phantom in FIG. 2. Similarly, in this case air knives 46a direct drying air against the substrate 11.

In any event, the air knives 46 (or 46a) by removing a liquid portion of either type (adsorbed or nonadsorbed) of the retained photopromoter 14 ensure that the actinic radiation does not pass through an appreciable liquid layer. This assurance makes it more likely that the actinic radiation will more faithfully expose the photopromoter only where desired by substantially eliminating refraction and diffusion.

The substrate 11 is next exposed to the actinic radiation 17 from one or more of the ultraviolet sources 48 and 49 by exposure facilities 50 to be described in greater detail subsequently. Such exposure renders the photopromoter-coated, nascent surface of the substrate 11 selectively capable of reducing thereon a pattern of a precious metal, the salt solution 19 of which is contained in a tank 52.

The substrate 11 next moves into the tank 52 containing the precious metal solution 19. In the tank 52 the precious metal is reduced onto the photopromoter pattern defined by the actinic radiation 17.

Following the reduction of the precious metal, the substrate may proceed through a tank 54 containing the water rinse 21, an electroless plating tank 56 containing the electroless plating bath 20, a tank 58 containing the electroplating bath 22, and a tank 60 containing the final water rinse 23. From the final rinsing tank 60 the substrate now containing a metallic pattern moves onto the take-up reel 40, after being contacted by a stream of drying air emitted by a blower 62 (at 24 in FIG. 1).

The electroless plating bath 20 in the tank 56 may be any one of a commercial variety, but is preferably a high speed bath so that dwell time of the substrate 11 in the tank 56 need not be overlong. Moreover, the electroless bath 20 may be capable of depositing copper, nickel, cobalt, palladium, platinum, silver or gold on the precious metal pattern. Typically, electroless plating occurs at rates of from 400 to 2000 A. per minute and autocatalytic. Specifically, after the nucleating sites provided by the precious metal pattern have been covered by electroless metal, such electroless metal provides further nucleating sites for itself. It has been observed that electroless plating action is initiated by precious metal patterns which are present in mere trace amounts. That is, precious metal patterns only a few atom layers thick "bring down" metal from an electroless bath.

A reducing agent may be placed in the electroless bath 20. Such an agent must be sufficiently "gentle" so that spontaneous reduction of metal from the electroless bath 20 is not induced except onto the precious metal pattern. Suitable reducing agents are hydrazine, formaldehyde, sodium hypophosphite, and certain borane compounds. The electroless bath 20 may be stabilized and controlled by the addition thereto of a complexing agent such as EDTA, cyanides or Rochelle salts.

Long term stability of electroless baths may be nonexistent due to spontaneous decomposition. Stability may be greatly improved by continuous filtration (by apparatus not shown) of the electroless bath 20 and by the addition thereto of stabilizing additives such as trace amounts of the cyanide ($CN^-$) ion in the amount of about .05 gram/liter. Such electroless baths may be used for weeks.

The electroplating bath 22 in the tank 58 may be any one of a commercial variety, such as a standard copper sulphate solution. Preferably, the bath 22 is high speed, such as one containing a copper fluoborate electrolyte capable of effecting electroplating rates as high as .5 mil per minute.

In the tank 58, the electrolessly plated conductive metal pattern is cathodically connected to the negative side of a plating current source 70 through the conductive roller 32a. This connection requires that the metallic pattern be electrically continuous. Such continuity is accomplished in one of two ways.

Figure 5B:
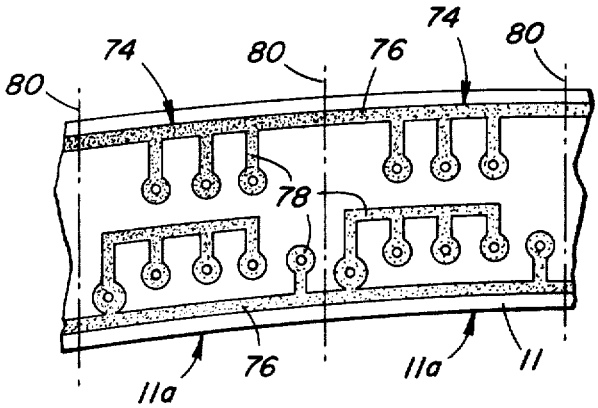
FIG. 5 is a perspective view of a few of the various products which can be made by the method shown in FIG. 1.
Figure 5A:
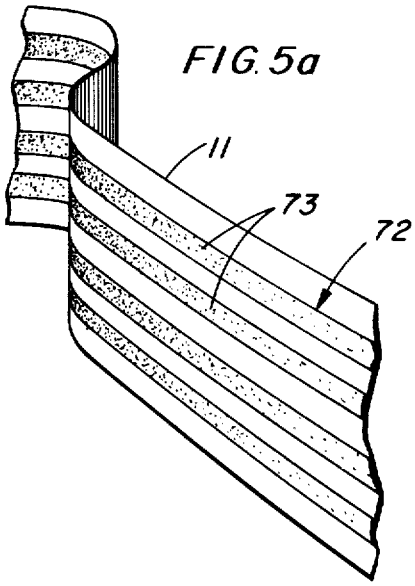
Figure 5C:
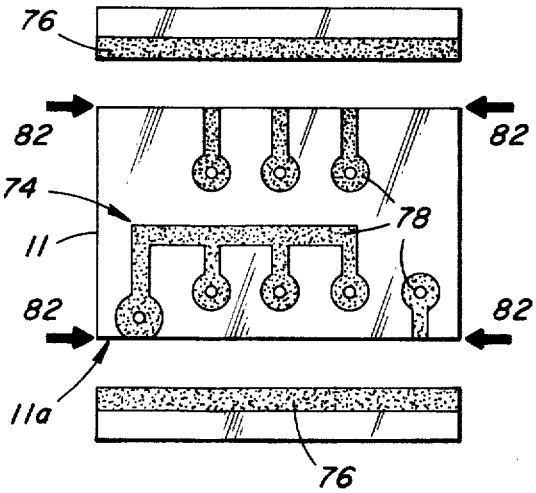
Figure 5D:
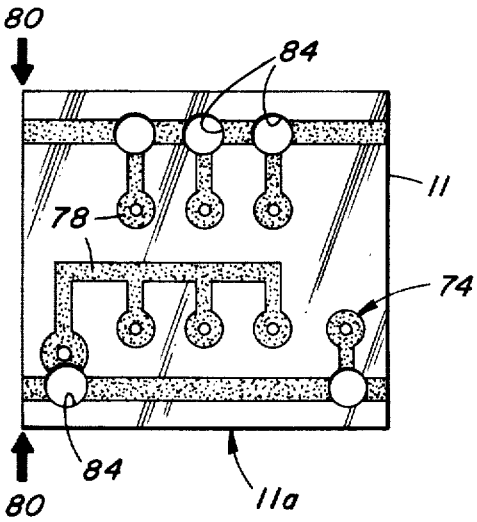

Referring to FIG. 5(a), the desired metallic pattern may be inherently continuous, such as when it comprises a straight cable pattern 72 including a plurality of parallel conductors 73. Alternatively, the desired metallic pattern may be inherently discontinuous such as the patterns 74 shown in FIG. 5(b). These latter patterns 74 may be produced continuously on the substrate 11 on serial portions 11a—11a thereof.

To accommodate such continuous production, part of the pattern generated by the exposure of the photopromoter 14 to the actinic radiation 17 and later electrolessly plated in the tank 56 is one or more common buses 76 which interconnect individual paths 78 of the patterns 74 and also interconnect the respective patterns 74 on the serial substrate portions 11a—11a. These common buses 76 contact the roller 32a to effect the desired electrical continuity.

After electroplating in the tank 58, the patterns 74 may be first severed along lines 80 to separate them and then the buses 76 are shorn off along lines 82 to electrically isolate the paths 78 as shown in FIG. 5. Alternatively, holes 84 may be punched in the separated patterns 74 to isolate the paths 78 from the buses 76. This alternative effects the retention of the bus 76 on the substrate portion 11a which may, in some cases, be useful.

Referring again to FIG. 2, in the tank 58 a plating anode 86 is also connected to the plating current source 70. The plating anode 86 may comprise two parts, namely a lower elongated portion 88, generally parallel to the substrate 11 in the tank 58, and an upper portion 90 which angles away from the substrate 11 below the point of entry of such substrate 11 into the electroplating bath 22. The angling away of the portion 90 prevents the electrolessly plated metal from exposure to plating currents of high density until a sufficient amount of electroplated metal is thereon.

Specifically, the thin electroless deposit is subject to "flashover" or "arc over" upon exposure thereof to the strong electroplating currents and high acidity in the bath 22. Accordingly, the anode portion 90 is angled away to decrease the current density during the initial entry of the electroless deposit into the tank 58. Such decreased current density does decrease the rate of buildup of electroplated metal, but this rate is sufficient so that when the substrate 11 reaches the anode portion 88, the deposit is able to withstand the higher current densities.

Figure 3:
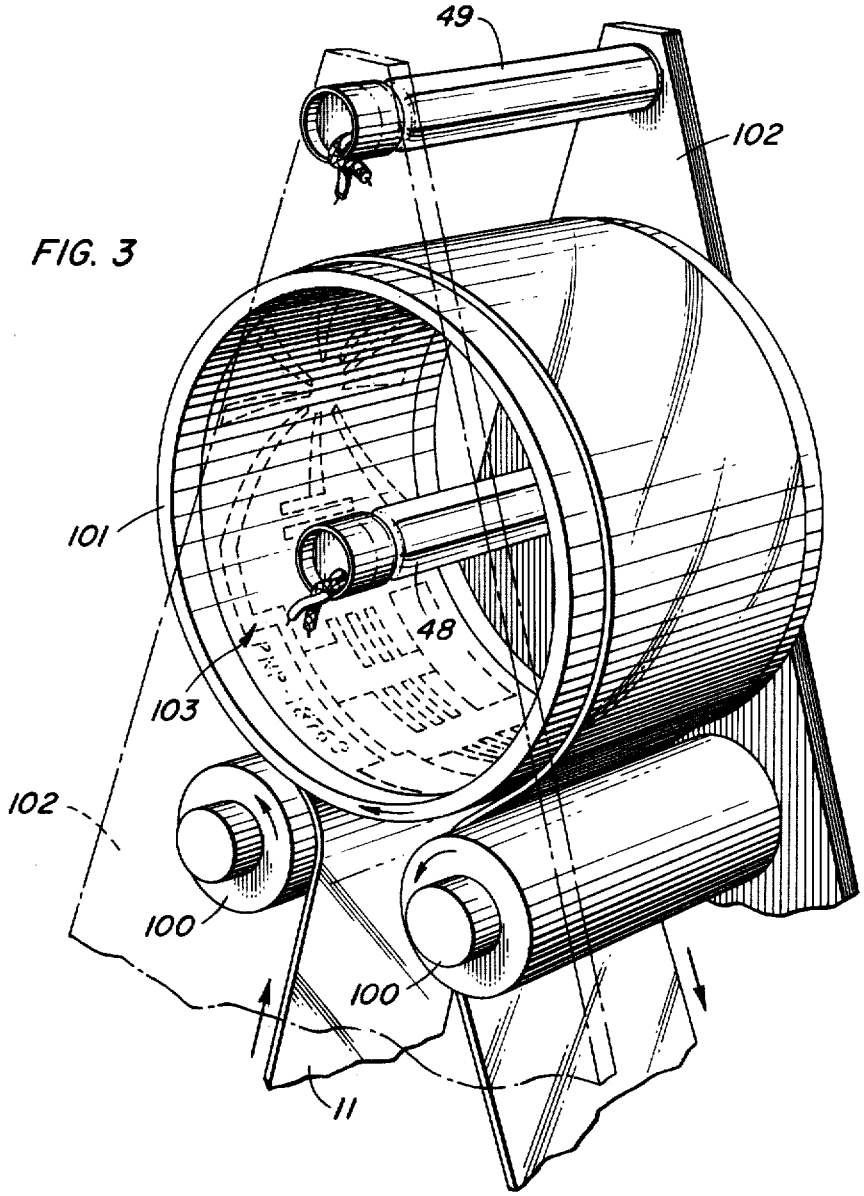
FIG. 3 is a perspective view of a portion of the apparatus of FIG. 2 showing an actinic radiation source which effects the generation of precious-metal-reducing patterns in accordance with the method of FIG. 1.

Referring now to FIG. 3, the facilities 50 are shown for selectively exposing the photopromoted substrate 11 to the actinic radiation (17 in FIG. 1).

The substrate 11 is wound sinuously about a pair of tension rollers 100 and an exposure cylinder or drum 101. The rollers are rotatably mounted under the cylinder 101 to a pair of supports 102 between which the cylinder 101 is positioned.

It has been observed that the actinic radiation of this invention is attenuated, and in fact nearly completely blocked by common glass, plastics, water, air, etc. Accordingly, the cylinder 101 is made of quartz, quartz-related glasses, or borosilicates which, it has been found, do not appreciably attenuate the radiation.

A mask pattern 103 is placed on either surface of the quartz cylinder 101 to produce the mask 18 of FIG. 1. Whether the mask is a negative or a positive of the final metallic pattern depends on the type of photopromoter 14, negative or positive, which is used, as previously discussed.

The mask pattern 103 may be any substance opaque to the actinic radiation 17 but is preferably a black ink, Ruby Lith, or a photoresist with or without a dye. Typically, the mask pattern 103 should be a material capable both of defining lines of less than one $\mu$, the present process being able to generate precious metallic patterns of such a dimension, and of completely blocking the actinic radiation 17.

It is noted that the cylinder 101 is nowhere attached to the supports 102 or to the rollers 100. Rather, tension in the substrate 11 due to the operation of the takeup 40 holds the cylinder 101 against the top of such rollers 100. Such tension also rotates the cylinder 101 as the substrate 11 moves, the cylinder and the substrate moving at the same speed in a 1:1 ratio. That is, any given point on the substrate 11 which initially contacts the cylinder 101 remains in the same position with respect to the cylinder and to the mask pattern 103 thereon until the substrate 11 moves away and toward the tank 52.

The ultraviolet sources 48 and 49 have an actinic radiation output substantially in the 1700–2800 A. range. One of the sources 48 is mounted within the cylinder 101. As the cylinder 101 and the substrate 11 move together, the source 48 constantly irradiates all portions of the photopromoted substrate surface next to the cylinder and which are not overlain by the mask pattern 103. If a negative photopromoter is used, nothing more need be done; the negative mask pattern allows the actinic radiation to pass through selected portions of the quartz cylinder 101 to render non-masked substrate areas in contact with the cylinder capable of reducing the precious metal. The substrate surface not touching the cylinder is not later capable of reducing the precious metal inasmuch as the actinic radiation is unable to pass through the substrate 11.

If a positive photopromoter is used two courses are available. In the first, the photopromoted substrate surface in contact with the cylinder 101 is exposed to the actinic radiation from the source 48 where a metallic pattern is not desired by virtue of the positive mask pattern 103. If the source 49 is not operated, the reverse side of the substrate, being already capable of reducing the precious metal and being unaffected by the radiation from the source 48 due to the attenuation thereof by the substrate, ultimately reduces the precious metal. This course produces a "ground plane" on the substrate separated from the metallic pattern.

The second course involves irradiating the reverse side of the substrate 11 with the other actinic source 49 to render all of the photopromoter therein incapable of reducing the precious metal. This second actinic source 49, of course, does not affect the substrate surface contacting the cylinder 101, again due to the attenuating effect of the substrate 11.

Figure 4A:
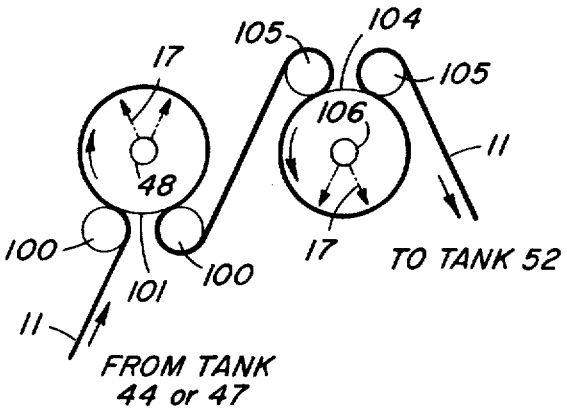
FIG. 4 is a stylized view of some of the alternatives to the apparatus shown in FIG. 3.

It should be apparent, in view of this description, that other actinic exposure expedients may be used. For example, a second cylinder 104 and a second set of tension rollers 105 immediately after and similar to the first cylinder 101 and rollers 100 may be used. The second cylinder 104 may contain a second different mask pattern through which the reverse side of the substrate 11 is selectively exposed to the actinic radiation 17 from a source 106 as shown in FIG. 4(a).

Numerous other schemes are possible for continuously generating multisided circuit patterns.

Figure 4B:
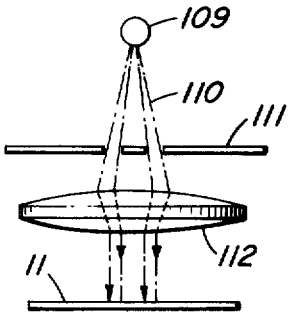

Moreover, the present method may also be realized in semicontinuous apparatus. Specifically, prior art step and repeat techniques are feasible. In this instance, the mask (not shown) is a planar quartz sheet having a mask pattern thereon. The photopromoted substrate is selectively exposed through the sheet to an actinic source appropriately close to the mask to prevent atmospheric attenuation of the actinic radiation. Also, it has been demonstrated that a projection system is feasible. Specifically, and referring to FIG. 4(b), an actinic source 109 passes radiation 110 through a mask 111 and then through a quartz lens 112 which focuses the mask image and the actinic radiation on the photopromoted substrate 11.

EXAMPLES OF POSITIVE PHOTOPROMOTERS (I) Polyimides served as substrates 11 in producing metallic patterns 72, 74 of ½–1 $\mu$ definition which were bonded strongly to the substrate 11.

Two general types of polyimides were used, namely, (a) commercial polyimide films, such as those sold as Kapton in thickness varying from 1 mil to 5 mils and up and (b) polyimide resins, such as those sold as Pyr M.L., which were coated on various miscellaneous bases. The resins were heat cured at 375–400° F. for about ½ hour after being coated onto the bases in thickness of 1 mil or more. Such heating produced polyimide surfaces substantially like that of Kapton film.

When polyimide films served as the substrate 11, the surfaces thereof were immersed in a cleaner 12 for periods of 1 minute or more, but preferably, for 4–5 minutes when the cleaner 12 comprised 10 N NaOH. Such immersion removed a small amount of the film, ensuring that the surfaces thereof were nascent. The films were then bathed in the clean water rinse 13 with agitation for from 1 to 4 minutes.

The polyimide resins coated onto miscellaneous bases to provide the substrate 11, were found, after curing, to be nascent. Accordingly, neither the cleaner 12 nor the rinse 13 was used with such cured resins.

The nascent character of both types of polyimide substrate is indicated by their ability to retain on surfaces thereof a thin layer of solutions into which the substrate surfaces are immersed.

Specifically, both types of substrates 11 having nascent surfaces were immersed in the following positive photopromoter solutions 14 under the following conditions:

| Substrate 11 | Photopromoter 14 | pH | Time of immersion, min. |
|---|---|---|---|
| Polyimide films and polyimide coated miscellaneous bases | .1 m. $SnCl_2$ | 1.0 | ¼–4 |
| | .045 m. $SnCl_2$ | 3.5 | ¼–2 |
| | .045–.1 m. $SnCl_2$ | 1–3.5 | 2–4 |
| | .1 m. $PbCl_2$ | 1–2 | ¼–4 |
| | .1 m. $TiCl_2$ | <1 | ¼–4 |

All of these photopromoters 14 were observed to adsorb onto the nascent polyimide substrate surface in thin layers (about 10–20 A.) and were thus retained by the substrate 11.

Both types of substrates 11 were then bathed in the clean water rinse for from 1–2 minutes. This bathing did not remove the adsorbed photopromoter 14. Rather, such bathing ensured that the photopromoter was adsorptively retained on the substrate 11 in the thinnest of possible layers.

Next, the photopromoted substrate 11 was dried by the air knives 46a, a stream of air being directed thereagainst for about ¼ minute.

Then the photopromoted substrates 11 were exposed to the actinic radiation 17 from the ultraviolet source 48 through the positive mask 18. Such exposure was effected, variously, by one or more 4–8 watt mercury lamps placed at varying distances from the quartz cylinder 101.

The amount of energy supplied to the substrate surfaces by the sources 48 and 49 was not found to be critical. Nevertheless, it was found desirable to irradiate the substrate surface at energy levels ranging from about 30 milliwatt-seconds per $CM^2$ to about 250 milliwatt-seconds per $CM^2$. Moreover, it was found that such energy levels were best supplied by sources 48 and 49 which emitted approximately 75% of their radiation at the 2537 A. line. It should be noted that sources were used which emitted radiation of less than 3000 A. Typically, such radiation ranged from about 1800 A. to about 2700 A.

The actinic exposure, as described above, generated a positive pattern on the substrate 11 capable of reducing a precious metal from a salt solution thereof. Specifically, the actinic exposure was found to render irradiated portions of the photopromoted substrate 11 incapable of reducing the precious metal by bringing about the transition of the metal ions of the photopromoter 14 from a low oxidation number, chemically active state to a higher oxidation number, chemically inactive state.

The exact mechanism by which the precious metal reducing pattern is generated is not clear. It is theorized, without dependence thereon, that immersion of the nascent substrate 11 into the photopromoter 14, followed by the rinse 16 and the drying, leaves the metal ions (derived from the metal salts in the photopromoter) adsorbed tenaciously on the polyimide substrate 11. These metal ions, in the case of tin, may ultimately be in one of the forms: $SnO.H_2O$ or $Sn(OH)_2$. Thus, the actinic radiation 17 may effect the precious metal reducing pattern in conjunction with adsorbed oxygen normally present on surface of the substrate.

One further observation was made regarding the mode of actinic exposure. Specifically, it was found that the actinic sensitivity of the photopromoted substrate increased with increasing humidity. That is, the higher humidity, the easier it was to generate the precious-metal-reducing pattern with lower energy output from the source 48.

After actinic exposure, the polyimide substrates were immersed in precious metal salt solutions 19. Some of these solutions and the parameters connected therewith are listed below:

| | pH | Time of immersion (approximate), min. |
|---|---|---|
| Precious metal salt solution: | | |
| .01 m. $PdCl_2$ | 1.2 | 2 |
| .01 m. $PtCl_2$ | 2 | 2 |
| .01 m. $PdCl_2$ | 1.0–1.5 | ½ |
| .0057 m. $PdCl_2$ | 1.0–1.5 | ½ |

Other salt solutions such as those of rhodium, silver or the other precious metals were used as well.

In any event, after immersion into the solutions 19, the precious-metal-reducing pattern reduced the precious metal from such solution 19. The precious metal was reduced in a thin layer, barely observable under polarized light, in the positive of the ultimately desired metallic pattern.

Next, the polyimide substrates 11 were bathed in the water rinse 21 for 1 or 2 minutes and then immersed into the electroless plating bath 20.

The bath 20 may be any type of autocatalytic electroless bath. Three different types of commercially available baths were used to electrolessly plate copper onto the precious metal positive pattern to a thickness of about 1500–200 A. as follows:

| Bath | Immersion Time, min. | Copper thickness, A. |
|---|---|---|
| Cuposit (Shipley) | .6 | 1,500+ |
| Enthone 400 | 4 | 1,500+ |
| Enthone 402 | 1 | 1,500+ |

Metals other than copper were deposited. Specifically, nickel and palladium were electrolessly plated onto the precious metal. In all cases, the precious metal provided nucleating sites for and catalyzed the electroless bath 20 and were present only in trace amounts. Compounds of metals, for example nickel-phosphide, were also electrolessly deposited.

The substrates 11 with the electroless metallic patterns thereon were then utilized as shown in FIG. 5. In many cases, however, thicker metallic patterns are desired. Accordingly, the substrates 11 were then immersed in the electroplating bath 22 to deposit copper thereon as follows:

| Type of bath 22 | pH | Immersion time, min. | Thickness electroplated, mils |
|---|---|---|---|
| Acid $Cu(SO_4)_2$ | 1.0 | 10 | 2 |
| Copper fluorborate (Allied Chem. Co.) | 1.0 | 4 | 2 |

Obviously, other baths, from which metals other than copper can be electroplated, are usable.

After bathing in the water rinse 23, the substrates 11 with the metal patterns 72, 74 were dried by the blower 62.

At this point, such patterns 72, 74 were subjected to either the pattern removal 28 or to the bond enhancement 29.

Some of the metallic patterns 72, 74 were carefully peeled off the substrate 11. This was able to be done even though the bond between the patterns and the polyimide was at least as strong as the pattern-substrate bonds of the prior art. The peeled-off patterns were subjected to additional electroplating to produce a thick, electroformed metallic article. Preferably, however, such additional electroplating was best performed while the metallic pattern remained on the substrate. This expedient minimized the possibility of damaging, as by bending, the rather fragile metallic pattern which, prior to the additional electroplating, is only slightly in excess of .002 inch thick.

Bond enhancement entailed heating the polyimide substrate 11 patterns 72, 74 structure in an atmosphere conducive to growing an oxide on the pattern. This technique was especially useful when the patterns 72, 74 were composed primarily of copper or nickel. The parameters of such bond enhancement follow:

| Substrate 11 | Patterns 72, 74 | Temperature, ° F. | Time, hr. | Atmosphere |
|---|---|---|---|---|
| Polyimide film 165 mil | 2 mil Cu | 400 | ½ | Ambient air. |
| " | 2 mil Ni | 500 | ½ | " |
| Polyimide film 2 mil | 2 mil Cu | 437 | 1–5 | " |
| Pyr M.L. about 1 mil | 2 mil Cu | 400 | 2–5 | " |
| " | 2 mil Ni | 400 | 2–5 | " |

It is theorized, no dependence on the theory being intended, that the polyimide substrates 11 are permeable, or somehow previous, to ambient air. Thus, heat plus the ambient air reaching the substrate-pattern interface through the substrate, effects the growth at such interface of an oxide of the metal composing the pattern. Such growth "drives" the oxide into the substrate, thereby greatly increasing the bond strength.

Patterns on polyimides produced in the above manner have been successfully used as circuit boards with electrical components attached thereto by soldering, T.C. bonding, and other high temperature, high force bonding techniques without adversely affecting the pattern, the substrate or the bond between the two.

ing in the holes 113 was contiguous with the pattern 74. In other words, the method of this invention was successfully used to produce circuit patterns with plated through-holes.

(III) Examples (I) and (II) were repeated without energizing the source 49. Produced were metallic patterns 72, 74 on one side of the substrate 11 and a metallic coating, or ground plate, completely covering the opposite side thereof both with (as in Example II) and without (as in Example I) the plated through-holes 113. When the through-holes were produced, the metal plated on the walls thereof was contiguous both with the metallic patterns 72, 74 and with the ground plane.

(IV) A substrate 11 of B stage epoxy tape, 8 mils thick was used in this example. The term "B stage" indicates that the epoxy was not fully cured. Full curing was effected by heating. An exemplary material is Fibermat 5 made by 3M Co. The following table shows the manner in which the subject method was applied to this substrate:

| | Substance | Time | pH | Other |
|---|---|---|---|---|
| Cleaner 12 | NaOH or | 1 min. or more | | |
| | Alconox or | 1 min. or more | | |
| | Preheating | Sufficient to render nascent | | |
| Water rinse 13 | D.I. $H_2O$ | 1–4 min. | | |
| Photopromoter 14 | .3m. $SnCl_2$ | 1–4 min. | <1 | Sonic agitation and heat may aid in photopromotion. |
| | .3m. $PbCl_2$ | 1–4 min | <1 | |
| | .3m. $TiCl_2$ | 1–4 min. | <1 | |
| Water rinse 16 | D.I. $H_2O$ | 1–2 min. | | |
| Drying 15 | | ¼min. | | |
| Actinic radiation 17 | | 30–250 milliwatt-sec./cm.$_2$ at 2,537 A. | | |
| Sensitizer 19 | | See Example (I) | | |
| Electroless bath 20 | | See Example (I) | | |
| Water rinse 21 | | See Example (I) | | |
| Electroplating bath 22 | | See Example (I) | | |
| Water rinse 23 | | See Example (I) | | |
| Drying 24 | | See Example (I) | | |
| Pattern removal | | | | May be used. |
| Bond enhancement, 325 ° F. 1 hr. | | | | |

Moreover, pattern definition of less than 1–2$\mu$, in both pattern thickness and separation, was achieved. The only factor seriously affecting the attainment of such definition appeared to be the accuracy to which the mask pattern 103 can be put on the cylinder 101 (or 104).

In the above example, the apparatus in FIGS. 2 and 3 was utilized. Also, the source 49 was continuously energized so that the patterns 72, 74 were produced only on one of the major surfaces of the polyamide substrate 11.

(II) Example (I) was repeated using only polyimide films, the initial cleaning step being preceded by the punching of holes through the substrate 11. The holes were punched within substrate portions on which the patterns 72, 74 were to ultimately reside.

The final product was a circuit board made of the substrate 11 and the pattern 74 with holes 113 having a metallic coating residing therein. The metallic coat- Cleaners 12 of NaOH or Alconox rendered the substrate 11 nascent so that the photopromoter 14 was adsorbed thereon. Preheating also rendered the substrate nascent by some uncertain mechanism, which may have been volatilization or evaporation of oily or other substances which prevent adsorption.

The method was then carried out as set forth previously in connection with the description of FIGS. 1, 2, and 3, and as described under Examples I–III. The molar concentration and the acidity of the photopromoter 14 was increased somewhat over the general range of values in Example I because it was slightly harder to effect the adsorption of adequate metallic ion from the photopromoter onto the substrate surface.

Metallic patterns 72, 74 were produced having definition 1–2$\mu$. These patterns could be used to form an electroformed article, or a circuit pattern after bond enhancement. In the latter event, bond enhancement 29 is effected by completely curing the B stage epoxy by heating to about 325° F. for about 1 hour. Heating and curing firmly bonds the patterns 72, 74 to the substrate 11.

(V) A substrate 11 was produced by coating various bases with a B stage, two-part, high temperature epoxy resin. An example of suitable material was a 2–5 mil coating of Scotchcast No. YR5155. As in the case of the polyimide resin, the surface of the epoxy resin was found to be nascent. Accordingly, the cleaner 12 and rinse 13 were not used.

All of the parameters, except bond enhancement, were then the same as the parameters given for Example IV. Bond enhancement was at 375° F. for about 1 hour. Again, a superior metallic pattern was produced.

(VI) A fired ceramic material was next used as a substrate 11. The surface thereof was rendered nascent by cleaning with trichloroethylene, acetone or heating. The rinse 13 was not used. The photopromoters 14 listed in Example IV were also used in this example.

Adsorption of the photopromoters onto the substrate 11 was noted, but the porous, rough nature of the surface apparently retained the photopromoter in greater than adsorbed quantities by other mechanisms. Accordingly even after the drying 15, the actinic radiation less easily generated the precious metal reducing pattern, because such radiation had to pass through a layer thicker than the usual adsorbed layer. Consequently, the range of energy of the actinic radiation was increased to about 150 to 1000 milliwatt-sec./cm.$^2$.

Such increased radiation produced a good metallic pattern 72, 74 well-adhered to the substrate 11. The remainder of this example was as in Example I, except that no bond enhancement 29 was used.

(VII) Example I was repeated using a polymerized tetrafluoroethylene, such as Teflon, as the substrate 11. After immersion in a cleaner 12 of hot, concentrated NaOH, the production of the metallic patterns 72, 74 proceeded as in Example I except for the bond enhancement.

The pattern-substrate bond was found to be considerably less than the materials of Examples I–VI and no expeditious bond enhancement 29 was found. Accordingly, such a substrate 11 was deemed ideal as a temporary substrate in producing an electroformed article.

(VIII) Example I was repeated using Mylar, as the substrate 11. After immersion in a cleaner 12 of dilute $H_2SO_4$, the metallic pattern generation proceeded as in Example I except for the bond enhancement.

The pattern-substrate bond was found to be similar to that of Example VII and, therefore, this substrate was deemed ideal as a temporary substrate in producing electroformed articles.

EXAMPLES OF NEGATIVE PHOTOPROMOTERS (IX) Fired ceramic was used as the substrate 11. After cleaning with either trichloroethylene and acetone or alternatively for 5 seconds in a solution of 3 parts $HNO_3$ and 2 parts HF to render the substrate nascent, the substrate was bathed in the rinse 13.

A number of negative photopromoters 14 were used, mercuric oxalate ($Hg_2C_2O_4$) or ferric oxalate ($Fe_2[C_2O_4]_3$)

solutions being preferred. The two preferred photopromoter solutions are either .1 M to .5 M $Hg_2C_2O_4$ or .1 M to .5 M $Fe_2(C_2O_4)_3$, both with a wetting agent, such as Leconal or Photo Flo plus a trace ($\mu$ ½%) of $HNO_3$ added thereto. The wetting agent is used because the negative photopromoters were not observed to adsorb on the substrate surface as were the positive. The purpose of the $HNO_3$ as an easily volatilized oxidizer has been previously described.

When the negative photopromotoer was used, two alternate modes of operation were followed. First, as with the positive photopromoters, the precious metal solution 19 was kept in the separate tank 52. Second, the photopromoter 14 and the solution 19 were both put in the tank 44, thus eliminating the tank 52. The second alternative is possible, of course, because the negative photopromoters do not reduce the precious metal until exposed to the actinic radiation.

The precious metal solution 19 comprised a salt solution of any of the precious metals, .5 M $AgNO_3$, .5 M $K_2PtClO_3$ or .5 M $PdCl_2$ being preferred. When the solutions 14 and 19 were mixed together in the tank 44, their ratio was 4 or 5 parts photopromoter 14 to one part precious metal salt solution 19. Some of the photopromoter-precious metal mixtures had added thereto one of the following solutions which were found to accelerate the effect of the actinic radiation on the photopromoter. The accelerators are:

.25 N $K_2PtCl_6$
.25 N $Na_2PdCl_4$
.5 N $AgNO_3$
.5 N AgBr
.25 N $Na_2PtCl_6$
.5 N $Hg(NO_3)_2$
.5 N HgCl (dissolved in Aqua Regia)

The rinse 16 was not used. The table below lists the parameters of the two process alternatives.

| | Material-solutions 14 and 19, not mixed | Time | Material-solutions 14 and 19 mixed | Time |
|---|---|---|---|---|
| Cleaner 12 | 3 parts $HNO_3$ plus 2 parts HF or trichloroethylene followed by acetone. | Until nascent and clean. | 3 parts $HNO_3$ plus 2 parts HF or trichloroethylene followed by tone. | Until nascent and clean. |
| Rinse 13 | Not used | | Not used | |
| Photopromoter 14 | $Hg_2C_2O_4$ or $Fe_2(C_2O_4)_3$ plus wetting agent plus trace $HNO_3$. | 1–4 minutes | 4 or 5 parts .1–.5 m. ($Hg_2C_2O_4$, $Fe_2(C_2O_4)_3$) plus 1 part .1–.5 m. ($PdCl_2$, $PtClO_3$, $AgNO_3$) | 1–4 minutes. |
| Rinse 16 | Not used | | Not used | |
| Dry 15 | | 5–10 minutes | | 5–10 minutes. |
| Actinic radiation 17 | | ~25 milliwatt-sec./cm.$^2$ | | |
| Precious metal salt solution 19 | $PdCl_2$, $K_2PtCl_6$, $AgNO_3$ | 1–4 minutes | Not used separately | |
| Rinse 21 | | 3–5 minutes | | 3–5 minutes. |
| Electroless bath 20 | | | | |
| Electroplating bath 22 | | | | |
| Rinse 23 | See Example (I) | | See Example (I) | |
| Dry 24 | | | | |

(X) Example IX was repeated using other substrate materials including fiberboard, Fiberglas, filled paper, and other miscellaneous materials. Results like those of Example IX were achieved.

It is to be understood that the above-described embodiments are simply illustrative of the principles of the invention. Numerous other arrangements and modifications may be devised by one skilled in the art without departing from the spirit and scope of the invention.

What is claimed is:

1. A method of rendering an article selectively capable of reducing thereon a precious metal from a precious metal salt which method comprises the steps of:

coating said article with a solution containing a salt of a metal selected from the group consisting of tin, titanium and lead, the oxidation state of the metal ion thereof being alterable by exposure to short wavelength ultraviolet light; and then producing a pattern capable of reducing said precious metal from said precious metal salt by selectively exposing portions of said coated article to short wavelength ultraviolet light.

2. The method of claim 1 wherein said metal ion is capable of reducing said precious metal.

3. The method of claim 2 wherein said metal salt in said solution is a halide.

4. The method according to claim 3 wherein said halide in said solution is selected from the group consisting of tin chloride, titanium chloride and lead chloride.

5. The method according to claim 4 wherein said ultraviolet light has a wavelength of less than 3000 A.

6. The method according to claim 5 wherein said ultraviolet light has a wavelength within the approximate range of about 1800 A. to about 2700 A.

7. The method of claim 6 wherein exposing selectively said coated article portions to said short wavelength ultraviolet light renders said metal ion at said coated article portions incapable of reducing said precious metal.

8. The method of claim 7 wherein about 75% of said short wavelength ultraviolet light is at approximately the 2537 A. line and said exposure is continued until said coated article portions receive energy amounting to about 30 milliwatt-seconds/cm.$^2$ to about 1000 milliwatt-seconds/cm.$^2$.

9. The method of claim 8 wherein said precious metal salts are selected from the group consisting of iridium, osmium, palladium, platinum, rhodium, ruthenium, gold and silver.

[ 10. A method of producing a metallic pattern on a substrate comprising the steps of:

coating the substrate with a first solution containing a metal salt selected from the group consisting of ferric oxalate, ferric citrate, ferric tartrate mercuric oxalate mercuric citrate and mercuric tartrate, the oxidation state of the metal ion thereof being alterable by exposure to short wavelength ultraviolet light;

producing a pattern capable of reducing a precious metal from a precious metal salt by selectively exposing portions of said coated substrate to short wavelength ultraviolet light;

immersing the substrate in a precious metal salt solution to reduce on said pattern said precious metal; and then placing said precious metal pattern in an electroless plating bath which is catalyzed by said reduced precious metal to produce the metallic pattern. ]

[ 11. The method according to claim 10 wherein said ultraviolet light has a wavelength of less than 3000 A. ]

[ 12. The method according to claim 11 wherein said ultraviolet light has a wavelength within the approximate range of about 1800 A. to about 2700 A. ]

[ 13. The method of claim 12 wherein exposing selectively said coated substrate to said short wavelength ultraviolet light renders said metal ion capable of reducing said precious metal. ]

[ 14. The method of claim 13 wherein about 75% of said short wavelength ultraviolet light is at approximately the 2537 A. line and said exposure is continued until said coated substrate receives energy amounting to approximately 25 milliwatt-seconds/cm.$^2$. ]

[ 15. The method of claim 14 wherein said precious metal salts are salts of metals selected from the group consisting of iridium, osmium, palladium, platinum, rhodium, ruthenium, gold and silver. ]

[ 16. The method of claim 15 wherein said coating and immersing steps are effected simultaneously by admixing said precious metal salts and said metal salts in said first solution. ]

17. A method of producing a precious metal pattern on a substrate, the pattern being usable to catalyze and reduce thereon metal from an electroless bath, which method comprises:

effecting the retention on selected areas of said substrate of a first solution containing a salt of a metal selected from the group consisting of tin, titanium and lead, the oxidation number of the metal ion of said first solution being alterable by exposure thereof to radiation deep within the ultraviolet spectrum;

selectively exposing said selected areas to said radiation to generate a pattern of said metal ion capable of reducing said precious metal; and then immersing said pattern in a second solution containing a salt of said precious metal to produce said precious metal pattern.

18. The method of claim 17 wherein said salt is a metal halide.

19. The method of claim 18 wherein said metal halide is selected from the group consisting of tin chloride, lead chloride and titanium chloride.

20. The method of claim 19 wherein said retention of said first solution is primarily by adsorption.

21. The method of claim 20 wherein said radiation is within the range of about 1800 A. to about 2700 A., with approximately 75% of said radiation being at about the 2537 A. line.

22. The method of claim 21 wherein said selective exposure continues until said substrate areas receive energy therefrom in the approximate range of about 30 milliwatt-seconds/cm.$^2$ to about 1000 milliwatt-seconds/cm.$^2$, the amount of said energy being approximately inversely proportional to the degree to which said first solution is adsorbed on said substrate.

23. A method of producing a metallic pattern on a nonconductive substrate comprising the steps of:

adsorbing onto selected surfaces of said substrate a metal halide solution, the metal being selected from the group consisting of tin, lead and titanium, the metal ion thereof being capable of reducing a precious metal from a precious metal salt;

exposing selected portions of said selected surfaces to ultraviolet light until said metal ion thereat is rendered incapable of reducing said precious metal from said precious metal salt, said selected portions conforming to a negative of said pattern and said ultraviolet light having a wavelength in the range of about 1800 A. to about 2700 A.;

immersing said substrate in said precious metal salt solution whereby said ion reduces said precious metal therefrom onto said surfaces in said pattern; and then immersing said substrate in an electroless plating bath which is catalyzed by said reduced precious metal to produce said metallic pattern.

24. The method of claim 23 which further includes an initial step of: forming holes through said substrate outside of said selected portions.

25. The method of claim 24 wherein said precious metal salt is a salt of a metal selected from the group consisting of iridium, osmium, palladium, platinum, rhodium, ruthenium, gold and silver.

26. A method of increasing the bond strength between a substrate and a metal pattern produced thereon by the method of claim 23 which comprises the steps of:

selecting a substrate having a predetermined service temperature and which is permeable to an atmosphere conducive to the formation of an oxide of said metal;

depositing said metal pattern on said substrate, said metal being oxidizable in said atmosphere at a second temperature less than said service temperature;

placing said substrate with said pattern thereon in said atmosphere; and then heating said pattern to said second temperature to form said oxide at the substrate-pattern interface until said bond strength is increased.

27. A method of increasing the bond strength between a metallic pattern electrolessly deposited on a polyimide substrate and the substrate by the method of claim 23, the substrate having a predetermined service temperature, which method comprises:

placing said substrate with said metal pattern thereon in an atmosphere conductive to the formation of an oxide of said metal, and then heating said metal pattern to a temperature less than said service temperature and sufficient to oxidize said metal until sufficient oxide formation takes place at the substrate-pattern interface to increase said bond strength.

28. A method of producing a metallic pattern on a substrate surface comprising the steps of:

a. selecting a suitable substrate;

b. immersing a surface of said substrate in a metal halide solution, said metal being selected from the group consisting of lead, tin and titanium, said metal halide solution having a molar concentration in the approximate range of about .045 to about .3, said solution being retained on said substrate surface;

c. exposing selectively said surface to ultraviolet light in a negative of said pattern, said light having approximately 75% of its radiation at about the 2537 A. line, said radiation supplying energy to said surface within the approximate range of from about 30 milliwatt-seconds/cm.$^2$ to about 1000 milliwatt-seconds/cm.$^2$.

d. immersing said exposed surface in a solution containing a salt of a precious metal selected from the group consisting of iridium, osmium, palladium, platinum, rhodium, ruthenium, gold and silver to reduce said metal in a positive of said pattern; and then e. immersing said surface in an electroless plating bath to electrolessly plate said precious metal positive to produce said metallic pattern.

29. The method of claim 28 in which step (a) further includes: selecting a substrate so that the retention of said solution on said substrate surface in step (b) is effected primarily by adsorption.

30. The method of claim 29 wherein in step (c) the amount of said energy is inversely proportional to the degree to which said solution is adsorbed on said substrate surface.

31. The method of claim 28 wherein step (b) further comprises: maintaining said metal halide solution at a pH within the approximate range of from about .8 to about 3.5 during said immersion.

32. The method of claim 31 wherein step (a) further comprises: selecting a substrate at least said surface of which is a polyimide.

33. The method of claim 32 wherein step (a) further comprises: cleaning said polyimide surface in NaOH, and then rinsing said polyimide surface in clean water.

34. The method of claim 33 wherein step (b) further comprises, after said immersion: rinsing said substrate surface in clean water, and then drying said substrate surface.

35. The method of claim 28 wherein step (a) further comprises: rendering said substrate surface nascent so that said solution in which said surface is immersed to adsorptively retained thereon.

36. A method of producing an electrical circuit pattern on a non-conductive substrate which comprises the steps of:

selecting a metal salt selected from the group consisting of tin halides, titanium halides, lead halides [, ferric oxalate, ferric citrate, ferric tartrate, mercuric oxalate, mercuric citrate and mercuric tartrate ];

coating said substrate with a solution containing said metal salt;

drying said coated substrate;

selectively exposing said dried substrate to radiation deep within the ultraviolet spectrum to generate a first pattern and a second pattern, said radiation being within the approximate range of 1800 A. to 2700 A. with approximately 75% of said radiation being at about the 2537 A. line, said radiation continuing until energy within the approximate range of 25 to 1000 milliwatt-seconds/cm.$^2$ has impinged on said dried substrate, said first pattern being capable of reducing a precious metal from a salt solution thereof, said second pattern being incapable of reducing a precious metal;

selecting a precious metal salt from the group of precious metals consisting of iridium, osmium, palladium, platinum, rhodium, ruthenium, gold and silver, said precious metal being catalytic to an electroless plating bath;

immersing said exposed substrate in a solution containing said precious metal salt, said first pattern reducing said precious metal thereon to generate a precious metal pattern; and then immersing said precious metal pattern in an electroless plating bath to produce said electric circuit pattern.

37. The method of claim 36 which comprises the additional step of: electroplating metal onto said electrical circuit pattern.

38. The method of claim 37 which comprises the additional step of: removing said substrate from said electroplated circuit pattern.

* * * * *

UNITED STATES PATENT OFFICE
CERTIFICATE OF CORRECTION

Patent No. RE 29,015 Dated October 26, 1976

Inventor(s) Michael Anthony DeAngelo-Donald Jex Sharp

It is certified that error appears in the above-identified patent and that said Letters Patent are hereby corrected as shown below:

In the specification, Column 1, line 42, "of Electroless" should read --on Electroless--. Column 8, line 27, "original state" should read --original oxidation state--. Column 10, line 18, "electroplate, the" should read --electroplate the--; line 34, "rage" should read --range--. Column 11, line 65, "rediated" should read --radiated--. Column 12, line 17, "rection" should read --reaction--. Column 21, first table, "Polyimide film 165 mil" should read --Polyimide film 1-5 mil--; line 59, "polyamide" should read --polyimide--. Column 22, line 18, "ground plate" should read --ground plane--.

Signed and Sealed this

Eighth Day of March 1977

[SEAL]

*Attest:*

RUTH C. MASON
*Attesting Officer*

C. MARSHALL DANN
*Commissioner of Patents and Trademarks*